(12) United States Patent
Jeon et al.

(10) Patent No.: US 7,453,386 B2
(45) Date of Patent: Nov. 18, 2008

(54) DIGITAL TO ANALOG CONVERTER AND SOURCE DRIVER

(75) Inventors: Yong-Weon Jeon, Suwon-si (KR); Ji-Woon Jung, Gwangmyeong-si (KR); Jo-Hyun Ko, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/832,095

(22) Filed: Aug. 1, 2007

(65) Prior Publication Data

US 2008/0030390 A1 Feb. 7, 2008

(30) Foreign Application Priority Data

Aug. 2, 2006 (KR) ............... 10-2006-0073066

(51) Int. Cl.
*H03M 1/66* (2006.01)
(52) U.S. Cl. ............... 341/145; 341/122; 341/144; 341/154; 345/89; 345/98; 345/100
(58) Field of Classification Search .......... 341/122, 341/145
See application file for complete search history.

(56) References Cited

U.S. PATENT DOCUMENTS

| | | | | |
|---|---|---|---|---|
| 5,877,717 A | * | 3/1999 | Tu et al. ................. | 341/150 |
| 5,914,682 A | * | 6/1999 | Noguchi ................. | 341/145 |
| 5,977,898 A | * | 11/1999 | Ling et al. ............. | 341/144 |
| 6,037,889 A | | 3/2000 | Knee | |
| 6,166,672 A | * | 12/2000 | Park ....................... | 341/145 |
| 6,191,720 B1 | * | 2/2001 | Zhang .................... | 341/145 |
| 6,268,817 B1 | * | 7/2001 | Min et al. ............... | 341/145 |
| 2006/0214900 A1 | * | 9/2006 | Tsuchi et al. .......... | 345/98 |
| 2008/0024478 A1 | * | 1/2008 | Yoshioka et al. ...... | 345/210 |
| 2008/0030489 A1 | * | 2/2008 | Kim et al. .............. | 345/205 |

FOREIGN PATENT DOCUMENTS

| | | |
|---|---|---|
| JP | 06120832 | 4/1994 |
| JP | 08032373 | 2/1996 |
| JP | 2002368592 | 12/2002 |
| JP | 2004260759 | 9/2004 |
| KR | 100190531 B1 | 1/1999 |
| KR | 1020000014400 A | 3/2000 |
| KR | 1020020095757 A | 12/2002 |
| KR | 1020060011509 A | 2/2006 |

* cited by examiner

*Primary Examiner*—Khai M Nguyen
(74) *Attorney, Agent, or Firm*—Volentine & Whitt, PLLC

(57) ABSTRACT

A digital to analog converter (DAC) converting digital data into a corresponding analog voltage is disclosed. The digital data includes upper bit data and lower bit data and the DAC includes; a first resistor circuit dividing first and second reference voltages to output a plurality of first division voltages, a first decoder selecting one of the first division voltages in response to the upper bit data, a second resistor circuit dividing third and fourth reference voltages to output a plurality of second division voltages, a second decoder selecting one of the second division voltages in response to the lower bit data, and a sample and hold circuit including a first capacitor and a second capacitor, and outputting the analog voltage in response to an output voltage from the first decoder and an output voltage from the second decoder, wherein the sample and hold circuit samples the output voltage of the first decoder during a sample mode, and adds the output voltages of the first and second decoders through the first and second capacitors to output a combined voltage during a hold mode.

7 Claims, 5 Drawing Sheets

Fig. 4

| Data[3:0] | Output of First Decoder - Before Sample Mode | Output of Second Decoder - Before Sample Mode | Output of DAC - Sample Mode | Output of DAC - Hold Mode |
|---|---|---|---|---|
| 0000 | 0V | 0V | 0V | 0V |
| 0001 | 0V | 1V | 0V | 1V |
| 0010 | 0V | 2V | 0V | 2V |
| 0011 | 0V | 3V | 0V | 3V |
| 0100 | 4V | 0V | 0V | 4V |
| 0101 | 4V | 1V | 0V | 5V |
| 0110 | 4V | 2V | 0V | 6V |
| 0111 | 4V | 3V | 0V | 7V |
| 1000 | 8V | 0V | 0V | 8V |
| 1001 | 8V | 1V | 0V | 9V |
| 1010 | 8V | 2V | 0V | 10V |
| 1011 | 8V | 3V | 0V | 11V |
| 1100 | 12V | 0V | 0V | 12V |
| 1101 | 12V | 1V | 0V | 13V |
| 1110 | 12V | 2V | 0V | 14V |
| 1111 | 12V | 3V | 0V | 15V |

DIGITAL TO ANALOG CONVERTER AND SOURCE DRIVER

CROSS-REFERENCE TO RELATED APPLICATIONS

This U.S. non-provisional patent application claims priority under 35 U.S.C. § 119 to Korean patent Application No. 10-2006-0073066 filed Aug. 2, 2006, the subject matter of which is hereby incorporated by reference.

BACKGROUND OF THE INVENTION

1. Field of the Invention

The present invention relates to a digital to analog converter (DAC).

2. Description of Related Art

Most physical phenomena may be expressed as an analog value (or a varying analog signal) within a defined range of values. Temperature, pressure, voltage, current, light intensity, voice frequency, position, velocity, angular velocity, flow rate, etc., may all be expressed an analog signal having an instantaneous value at a point in time over a continuous range of possible values. Many analog ranges or scales may be used to accurately indicate the nature of the detected or measured phenomenon of interest.

Unfortunately, analog signals can not be manipulated by digital computational systems. Such systems require conversion of an analog signal into corresponding digital data. This process is referred to as analog to digital conversion (ADC). Analog signals may be converted into corresponding digital data by assigning digital data values to respective portions of an analog scale, and then comparing an instantaneous value for a received analog signal to the defined set of digital values.

Since digital computational systems output digital data, application of the data to an analog system requires a process of converting digital data into analog data (or an analog signal). Digital to analog conversion (D/A) is a process characterized by receiving a digital value represented by a digital code and then converting it into a predetermined analog value proportion to the digital value. During D/A conversion, a reference voltage (Vref) is commonly used to determine a maximum or maximum signal value for a constituent DAC. For example, 16 unique binary values may be represented by 4 bits of information. Thus, a voltage output (Vout) by a DAC receiving 4 bit digital data may have up to 16 different output levels. The actual analog output voltage Vout is proportional to the digital input value, and may be expressed as a multiple of the input digital value.

Given a fixed and constant reference voltage Vref, the output voltage Vout provided by a conventional DAC under the forgoing assumptions will only vary across a range of 16 possible voltage levels. This being the case, the output voltage Vout is far from being a true analog signal (i.e., a truly continuous signal). However, as number of possible output values is increased by increasing the number of bits of input data, the analog quality of the voltage output signal is improved.

One approach to the implementation of many competent DACs is the use of a sample and hold circuit implemented using an operational amplifier (Op-Amp). While offering significant design and performance benefits, this approach suffers from the presence of a parasitic capacitance at the input terminal of the Op-Amp. This parasitic capacitance has an adverse effect on the output of the DAC when modulating a voltage level of a non-inverting input terminal of the Op-Amp.

SUMMARY OF THE INVENTION

Embodiments of the invention provide a circuit reducing the output error of a digital to analog converter (DAC) by mitigating the effects of a parasitic capacitance apparent at an input terminal of an operational amplifier (Op-Amp) implementing the DAC.

In one embodiment, the invention provides a digital to analog converter (DAC) converting digital data into a corresponding analog voltage, the digital data having upper bit data and lower bit data, the DAC comprising; a first resistor circuit dividing first and second reference voltages to output a plurality of first division voltages, a first decoder selecting one of the first division voltages in response to the upper bit data, a second resistor circuit dividing third and fourth reference voltages to output a plurality of second division voltages, a second decoder selecting one of the second division voltages in response to the lower bit data, and a sample and hold circuit including a first capacitor and a second capacitor, and outputting the analog voltage in response to an output voltage from the first decoder and an output voltage from the second decoder, wherein the sample and hold circuit samples the output voltage of the first decoder during a sample mode, and adds the output voltages of the first and second decoders through the first and second capacitors to output a combined voltage during a hold mode.

In another embodiment, the invention provides a source driver circuit comprising adapted for use in a Liquid Crystal Display, and comprising a digital to analog converter (DAC) converting digital data into a corresponding analog voltage, the digital data having upper bit data and lower bit data, the DAC comprising; a first resistor circuit dividing first and second reference voltages to output a plurality of first division voltages, a first decoder selecting one of the first division voltages in response to the upper bit data, a second resistor circuit dividing third and fourth reference voltages to output a plurality of second division voltages, a second decoder selecting one of the second division voltages in response to the lower bit data, and a sample and hold circuit including a first capacitor and a second capacitor, and outputting the analog voltage in response to an output voltage from the first decoder and an output voltage from the second decoder, wherein the sample and hold circuit samples the output voltage of the first decoder during a sample mode, and adds the output voltages of the first and second decoders through the first and second capacitors to output a combined voltage during a hold mode.

In another embodiment, the invention provides a Liquid Crystal Display (LCD) comprising; a timing controller driving a source driver and a gate driver, wherein the source driver is connected to the source of a NMOS transistor in an array of LCD pixel elements and the gate driver is connected to the gate of the NMOS transistor, wherein the source driver is implemented using a digital to analog converter (DAC) converting digital data into a corresponding analog voltage, the digital data having upper bit data and lower bit data, the DAC comprising; a first resistor circuit dividing first and second reference voltages to output a plurality of first division voltages, a first decoder selecting one of the first division voltages in response to the upper bit data, a second resistor circuit dividing third and fourth reference voltages to output a plurality of second division voltages, a second decoder selecting one of the second division voltages in response to the lower bit data, and a sample and hold circuit including a first capacitor and a second capacitor, and outputting the analog voltage in response to an output voltage from the first decoder and an output voltage from the second decoder, wherein the sample and hold circuit samples the output voltage of the first decoder during a sample mode, and adds the output voltages of the first and second decoders through the first and second capacitors to output a combined voltage during a hold mode.

BRIEF DESCRIPTION OF THE FIGURES

FIG. 4 is a comparison table illustrating outputs of first and second decoders before a sample mode, and outputs of the DAC in the sample mode and a hold mode, respectively, when 4-bit digital data is applied to the DAC of FIG. 1.

DESCRIPTION OF EMBODIMENTS

The present invention will be described in the context of several exemplary embodiments shown in the accompanying drawings. The invention may, however, be variously embodied and should not be construed as being limited to only the illustrated embodiments.

In the present invention, a digital-to-analog converter (DAC) block receives a digital signal and converts it to a corresponding analog signal. The analog signal may then be output to an external circuit, such as a display apparatus.

Figure 1:
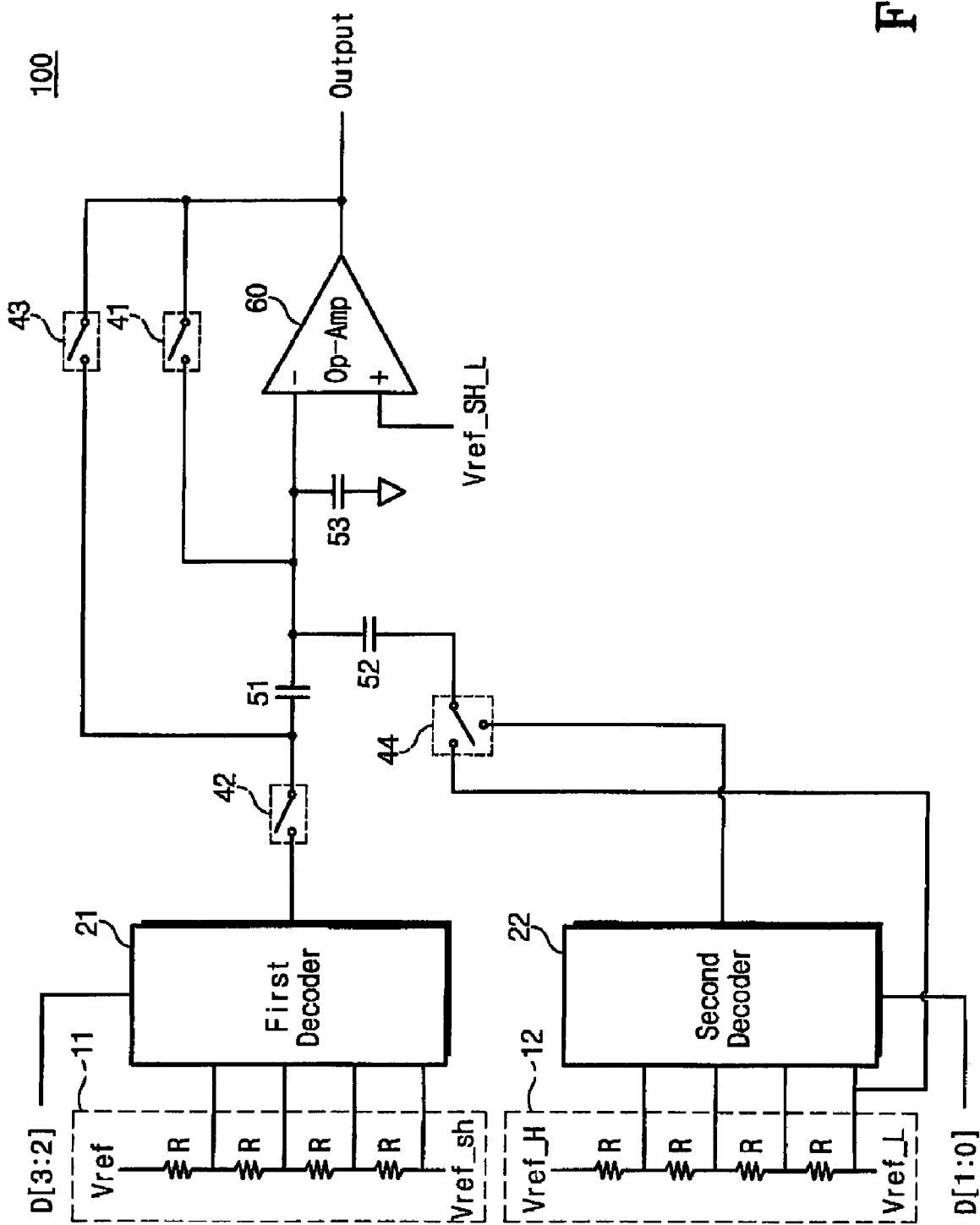
FIG. 1 is a block diagram illustrating a digital to analog converter (DAC) according to an embodiment of the invention.

FIG. 1 is a block diagram illustrating a DAC according to an embodiment of the invention. DAC 100 of FIG. 1 has a modified structure of an R-type DAC. Referring to FIG. 1, the effects of a parasitic capacitor 53 apparent in the DAC may be cut off by connecting the non-inverting terminal of an operational amplifier (Op-Amp) 60 to a fifth reference voltage Vref_SH_L, and by connecting a first capacitor 51 and second capacitor 52 in the illustrated manner.

A first reference voltage ("Vref") is used to determine an analog output voltage. A second reference voltage ("Vref_sh"), a fourth reference voltage ("Vref_L"), and the fifth reference voltage (Vref_SH_L") may be arbitrarily set, e.g. to ground (VSS). A third reference voltage ("Vref_H") is a fractional voltage derived in relation to the number of bits of digital data. For instance, when dividing n-bit digital data into an upper bit of n/2 bit and a lower bit of (n/2)-1 bit, and thereafter decoding these values, a first decoder 21 outputs a voltage having a level defined as the difference between Vref and Vref_L divided by $2^{n/2}$. A second decoder 22 outputs a voltage having a level defined as the voltage level of first decoder 21 divided by $2^{n/2}$.

Resistor circuits 11 and 12 output a plurality of voltages by dividing the applied reference voltages in proportion to the resistance. That is, first resistor circuit 11 outputs voltages by equally dividing a voltage difference between the Vref and the Vref_sh in proportion to the resistance. For example, when the Vref is 16V and the Vref_sh is 0V, the first resistor circuit 21 outputs 0V, 4V, 8V, 12V and 16V, respectively. Second resistor circuit 12 outputs a plurality of voltages by dividing a quarter of the output voltage of the first resistor circuit 11 in proportion to the resistance. For example, when the Vref, the Vref_sh, and the Vref_L are 16V, 0V, 0V, respectively, the Vref_H is set to 4V. That is, second resistor circuit 12 outputs 0V, 1V, 2V and 3V, respectively.

Switches 41 through 44 are used to initialize an output or define a sample mode and a hold mode. First switch 41 initializes the output. Second switch 42 determines the sample mode for the sample and hold circuit. Third switch 43 forms a feedback loop during the hold mode. Fourth switch 44 connects first capacitor 51 and second capacitor 52 during the hold mode.

The sample and hold circuit is configured with first capacitor 51, second capacitor 52, Op-Amp 60, and switches 41 through 44. The sample and hold circuit is used to receive signals from external sources. That is, the sample and hold circuit can combine data applied from one source during the sample mode and data applied from another source during the hold mode.

Figure 2:
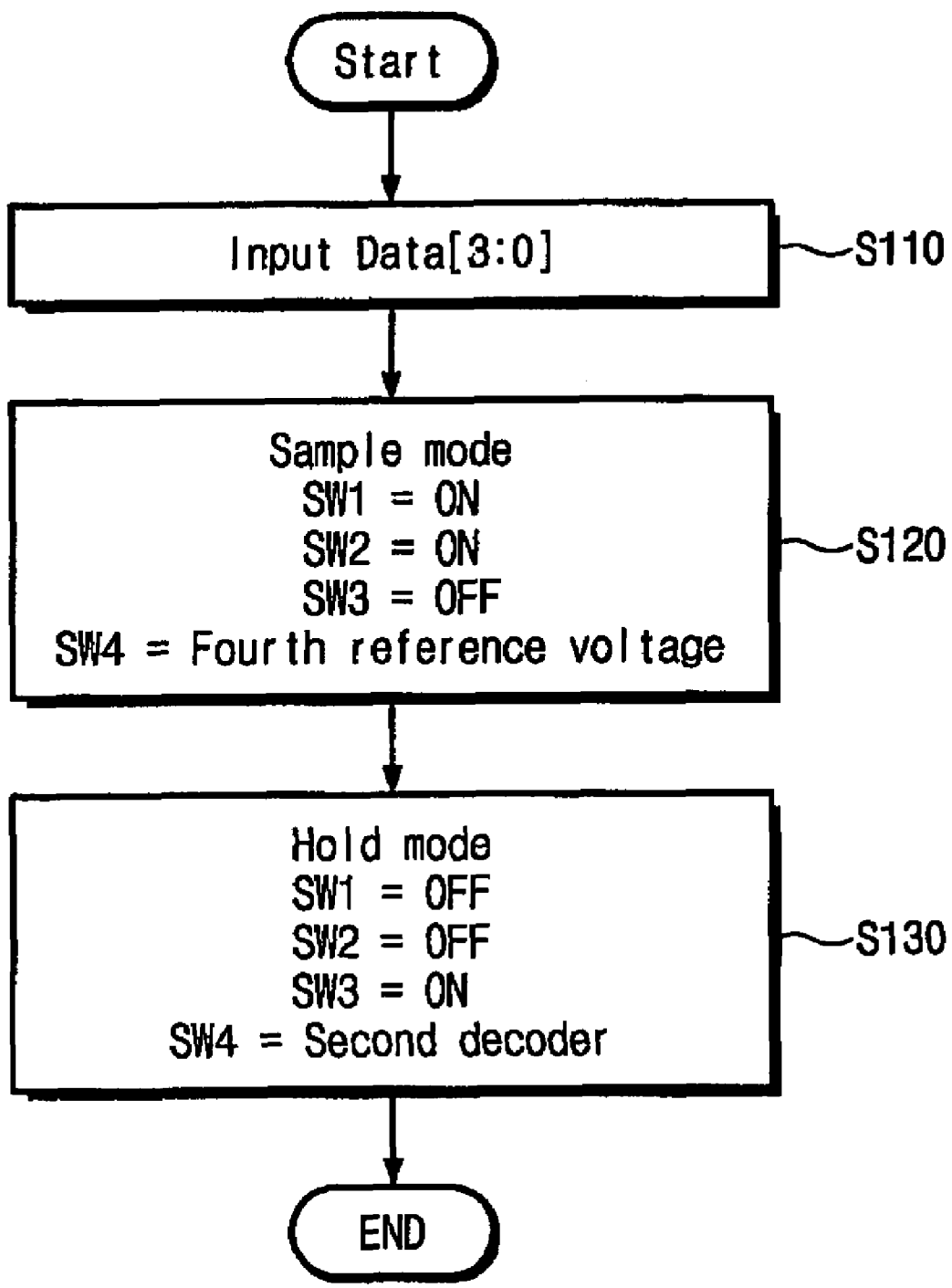
FIG. 2 is a flowchart further illustrating operation of the DAC of FIG. 1.

FIG. 2 is a flowchart further illustrating operation of the DAC of FIG. 1. Referring to FIGS. 1 and 2, DAC 100 is assumed to convert 4-bit digital data into a corresponding analog voltage. In order to minimize the area required to implement DAC 100, the decoding function is divided across two decoders, e.g., first and second decoders 21 and 22. That is, received digital data is divided into upper bit(s) and lower bit(s). The upper bit of the digital data is applied to first decoder 21. The lower bit of the digital data is applied to second decoder 22. While $2^4$ (or 16) resistors and one 16×1 decoder are required for decoding the 4-bit digital data if using one decoder, $8(=2^2+2^2)$ resistors and two 4×1 decoders are only required for decoding the 4-bit digital data if using the two decoders.

In operation, the 4-bit digital data Data[3:0] is applied to first decoder 21 and second decoder 22 (S110).

The sample mode for the sample and hold circuit is selected (S120). During the sample mode, the output voltage of first decoder 21 is applied to the inverting input terminal of Op-Amp 60 through first capacitor 51. An output voltage stored in first capacitor 51, i.e., the output voltage of first decoder 21, is provided as the output of DAC 100.

For example, it is assumed that applied 4-bit digital data is "1010", and that Vref, Vref_sh, and Vref_L are 16V, 0V and 0V, respectively. Thus the upper bits and lower bit are "10 and "10", respectively. First decoder 21 receives the upper bits and outputs 8V. The output of first decoder 21 is applied to the inverting input terminal of Op-Amp 60 through first capacitor 51 via second switch 42. Here, fourth switch 44 is connected to the Vref_L. Since the difference between the voltage applied to the non-inverting input terminal and the voltage applied to the inverting input terminal of Op-Amp 60 is 0V, the output of the DAC becomes 0V.

In the foregoing, first switch 41 is turned ON, second switch 42 is turned ON, third switch 43 is turned OFF, and fourth switch 44 is connected to the Vref_L.

Next, the hold mode for the sample and hold circuit is selected (S130). First switch 41 is turned OFF, second switch 42 is turned OFF, third switch 43 is turned ON, and fourth switch 44 is connected to the output of second decoder 44. During the hold mode, the output voltage stored at first capacitor 51, (i.e., the output voltage of first decoder 21), and the output voltage of second decoder 22 through second capacitor 52 are added together and then output.

Figure 3:
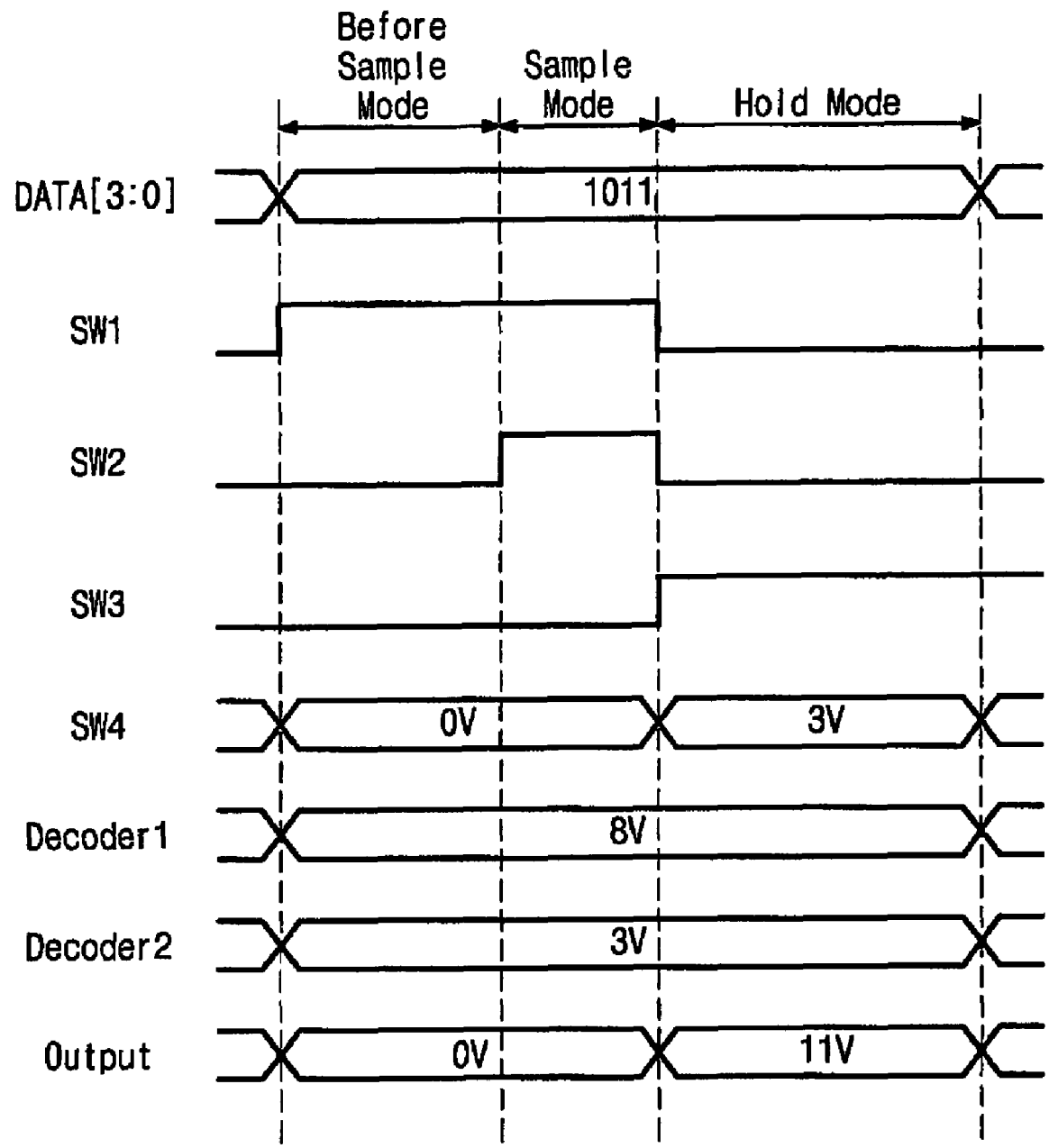
FIG. 3 is a timing diagram further illustrating the operation of the DAC of FIG. 1.

FIG. 3 is a timing diagram further illustrating the operation of the DAC of FIG. 1. FIG. 3 illustrates specific operation of the switches implementing DAC 100, as well as the respective outputs of the first and second decoders and the final output. Referring to FIGS. 1 and 3, it is assumed that a digital signal "1011" is applied, the output of first decoder 21 is 8V, and the output of second decoder 22 is 3V. The output of DAC 100 is 0V in the sample mode. The output of DAC 100 is 11V in the hold mode.

FIG. 4 is a comparison table further illustrating the outputs of first and second decoders before the sample mode, and outputs of the DAC in the sample mode and the hold mode, respectively, when 4-bit digital data are inputted into the DAC of FIG. 1. Referring to FIGS. 1 and 4, the output voltage of the DAC is 0V during the sample mode, and the output voltage of the DAC is equal to the output of the first decoder and the output of the second decoder during the hold mode.

Figure 5:
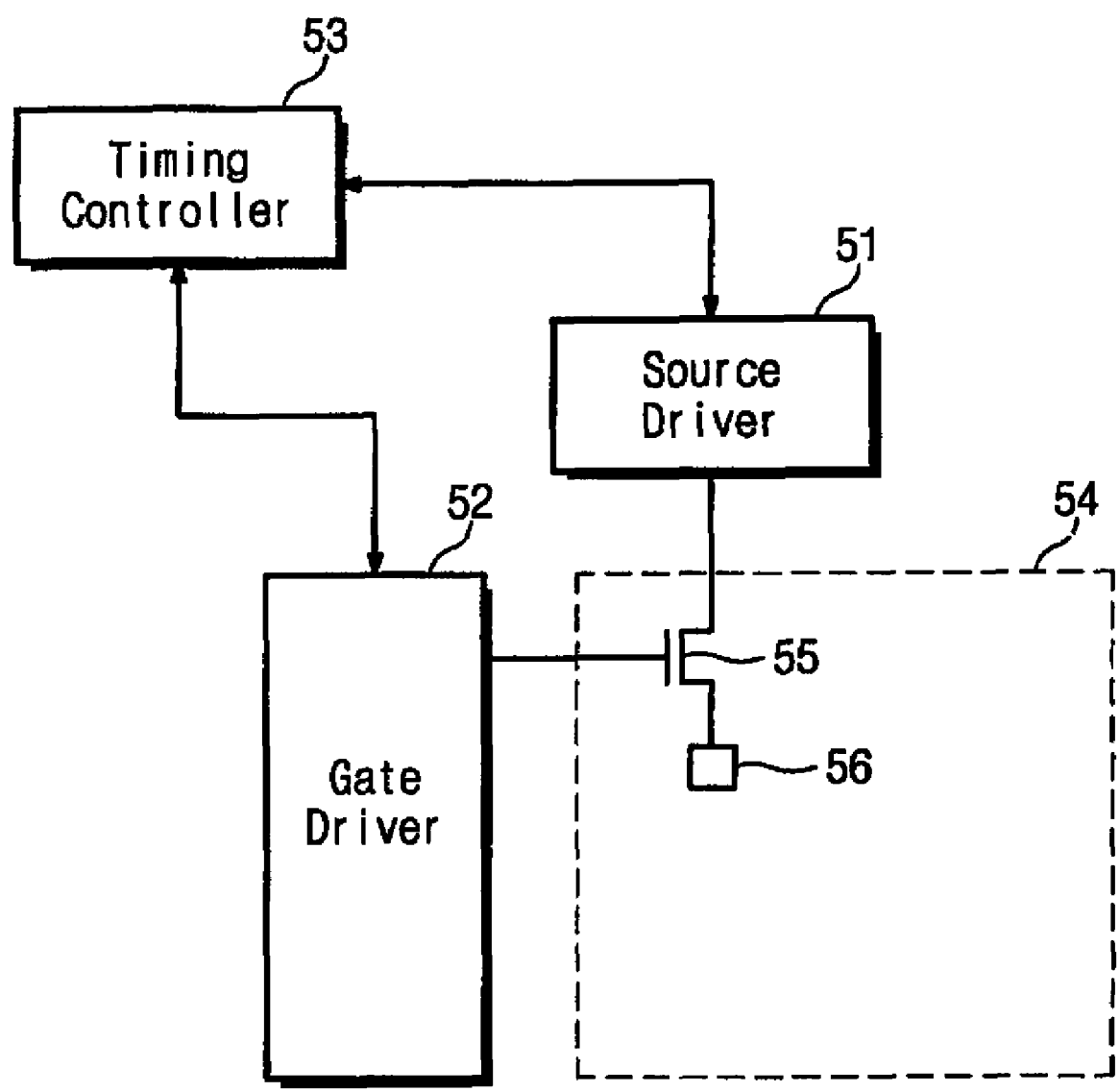
FIG. 5 is a block diagram illustrating a liquid crystal display (LCD) incorporating a DAC according to an embodiment of the invention.

FIG. 5 is a block diagram illustrating a liquid crystal display (LCD) system susceptible to the incorporation of a DAC according to an embodiment of the present invention. For example, a DAC according to an embodiment of the present invention may be incorporated within a source driver 51 of the LCD. A timing controller 53 controls source driver 51 as well as a gate driver 52.

Source driver 51 is connected to the source of an NMOS transistor 55. Gate driver 52 is connected to the gate of NMOS transistor 55. The drain of NMOS transistor 55 is connected to a pixel electrode 56. LCD 54 is conventionally configured within an array of pixel electrodes.

The present invention provides a DAC that mitigates the effects of parasitic capacitance at an input terminal of an Op-Amp caused by modulating of a voltage level at a non-inverting input terminal of the Op-Amp when employing a sample and hold circuit realized by using the Op-Amp.

As described above, according to the present invention, it is possible to mitigate the effects of the parasitic capacitance by employing a sample and hold circuit realized using the Op-Amp.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A digital to analog converter (DAC) converting digital data into a corresponding analog voltage, the digital data having upper bit data and lower bit data, the DAC comprising:
    a first resistor circuit dividing first and second reference voltages to output a plurality of first division voltages;
    a first decoder selecting one of the first division voltages in response to the upper bit data;
    a second resistor circuit dividing third and fourth reference voltages to output a plurality of second division voltages;
    a second decoder selecting one of the second division voltages in response to the lower bit data; and
    a sample and hold circuit including a first capacitor and a second capacitor, and outputting the analog voltage in response to an output voltage from the first decoder and an output voltage from the second decoder,
    wherein the sample and hold circuit samples the output voltage of the first decoder during a sample mode, and adds the output voltages of the first and second decoders through the first and second capacitors to output a combined voltage during a hold mode.

2. The DAC of claim 1, wherein the output of the second decoder is transmitted to the first capacitor through the second capacitor such that the respective outputs of the first and second decoders are added during the hold mode.

3. The DAC of claim 1, wherein the sample and hold circuit comprises:
    an operational amplifier (Op-Amp) including an inverting input terminal, a non-inverting input terminal receiving a fifth reference voltage, and an output terminal;
    a second switch transmitting the output voltage of the first decoder to the inverting input terminal of the Op-Amp through the first capacitor during the sample mode;
    a first switch electrically connecting the inverting input terminal of the Op-Amp to the output terminal of the Op-Amp during the sample mode;
    a third switch electrically connecting the second switch to the output terminal of the Op-Amp during the hold mode; and
    a fourth switch selecting the fourth reference voltage during the sample mode and selecting the output voltage of the second decoder during the hold mode,
    wherein the voltage selected by the fourth switch is communicated to the first capacitor through the second capacitor.

4. The DAC of claim 1, wherein the first resistor circuit is connected in series between the first and second reference voltages, and comprises a plurality of resistors corresponding to the upper bit data.

5. The DAC of claim 1, wherein the second resistor circuit is connected in series between the third and fourth reference voltages, and comprises a plurality of resistors corresponding to the lower bit data.

6. A source driver circuit comprising adapted for use in a Liquid Crystal Display, and comprising:
    a digital to analog converter (DAC) converting digital data into a corresponding analog voltage, the digital data having upper bit data and lower bit data, the DAC comprising:
    a first resistor circuit dividing first and second reference voltages to output a plurality of first division voltages;
    a first decoder selecting one of the first division voltages in response to the upper bit data;
    a second resistor circuit dividing third and fourth reference voltages to output a plurality of second division voltages;
    a second decoder selecting one of the second division voltages in response to the lower bit data; and
    a sample and hold circuit including a first capacitor and a second capacitor, and outputting the analog voltage in response to an output voltage from the first decoder and an output voltage from the second decoder,
    wherein the sample and hold circuit samples the output voltage of the first decoder during a sample mode, and adds the output voltages of the first and second decoders through the first and second capacitors to output a combined voltage during a hold mode.

7. A Liquid Crystal Display (LCD) comprising:
    a timing controller driving a source driver and a gate driver, wherein the source driver is connected to the source of a NMOS transistor in an array of LCD pixel elements and the gate driver is connected to the gate of the NMOS transistor;
    wherein the source driver is implemented using a digital to analog converter (DAC) converting digital data into a corresponding analog voltage, the digital data having upper bit data and lower bit data, the DAC comprising:
    a first resistor circuit dividing first and second reference voltages to output a plurality of first division voltages;
    a first decoder selecting one of the first division voltages in response to the upper bit data;
    a second resistor circuit dividing third and fourth reference voltages to output a plurality of second division voltages;

a second decoder selecting one of the second division voltages in response to the lower bit data; and a sample and hold circuit including a first capacitor and a second capacitor, and outputting the analog voltage in response to an output voltage from the first decoder and an output voltage from the second decoder, wherein the sample and hold circuit samples the output voltage of the first decoder during a sample mode, and adds the output voltages of the first and second decoders through the first and second capacitors to output a combined voltage during a hold mode.

* * * * *